United States Patent [19]

Davies et al.

[11] Patent Number: 5,399,457
[45] Date of Patent: Mar. 21, 1995

[54] PROCESS FOR REDUCING SLUDGE IN DIFFUSION TRANSFER PRINTING PLATES

[75] Inventors: Paul Davies, Shoreview; Elsie A. Fohrenkamm, St. Paul, both of Minn.

[73] Assignee: Minnesota Mining and Manufacturing Company, St. Paul, Minn.

[21] Appl. No.: 138,244

[22] Filed: Oct. 15, 1993

[51] Int. Cl.$^6$ .................. G03C 5/54; G03C 5/26
[52] U.S. Cl. ................. 430/204; 430/244; 430/249; 430/488; 430/490; 430/491
[58] Field of Search ............... 430/204, 249, 244, 488, 430/490, 491

[56] References Cited

U.S. PATENT DOCUMENTS

| | | |
|---|---|---|
| 2,656,273 | 10/1953 | Henn et al. ............... 430/491 |
| 2,688,548 | 9/1954 | Reynolds ................. 430/490 |
| 3,186,842 | 6/1965 | DeHaes et al. ............ 96/29 |
| 3,300,306 | 1/1967 | Sevens et al. ............ 96/29 |
| 3,549,364 | 12/1970 | Morse .................... 430/249 |
| 3,567,443 | 3/1971 | DeHaes et al. ............ 96/29 |
| 3,728,114 | 4/1973 | Futaki et al. ............ 96/29 L |
| 3,730,716 | 5/1973 | Land et al. .............. 430/234 |
| 3,857,710 | 12/1974 | Speers ................... 96/61 M |
| 3,870,479 | 3/1975 | Kuboter et al. ........... 430/204 |
| 3,938,997 | 2/1976 | Fisch et al. ............. 96/66.3 |
| 3,942,985 | 3/1976 | Newman et al. ........... 96/66.3 |
| 3,989,521 | 11/1976 | DeHaes et al. ............ 96/29 L |
| 4,160,670 | 7/1979 | Tsubai et al. ............ 96/119 R |
| 4,310,613 | 1/1982 | Iguchi et al. ............ 430/251 |
| 4,361,635 | 11/1982 | Kinderman et al. ......... 430/14 |
| 4,873,180 | 10/1989 | Marchesano et al. ........ 430/491 |
| 4,892,804 | 1/1990 | Vincent et al. ........... 430/491 |
| 4,985,348 | 1/1991 | Hirano et al. ............ 430/488 |
| 5,059,508 | 10/1991 | Vaes et al. .............. 430/204 |
| 5,196,298 | 3/1993 | Meeus et al. ............. 430/490 |
| 5,268,253 | 12/1993 | Van Rompuy .............. 430/204 |
| 5,283,156 | 2/1994 | Monbaliu et al. .......... 430/204 |

FOREIGN PATENT DOCUMENTS

| | | |
|---|---|---|
| 0397926A1 | 5/1989 | European Pat. Off. . |
| 0423399A1 | 10/1989 | European Pat. Off. . |
| 0496127A1 | 1/1991 | European Pat. Off. . |
| 0498968A1 | 2/1991 | European Pat. Off. . |
| 0531582A1 | 9/1991 | European Pat. Off. . |
| 0481562A1 | 10/1991 | European Pat. Off. . |
| 0546598A1 | 11/1992 | European Pat. Off. . |
| 0546599A1 | 11/1992 | European Pat. Off. . |
| 0547660A1 | 12/1992 | European Pat. Off. . |
| 0554585A1 | 12/1992 | European Pat. Off. . |
| WO93/11456 | 6/1993 | WIPO . |
| WO93/11468 | 6/1993 | WIPO . |

OTHER PUBLICATIONS

Research Disclosure, Dec. 1979, pp. 692–693, No. 18837, Purol et al.

*Primary Examiner*—Richard L. Schilling
*Attorney, Agent, or Firm*—Gary L. Griswold; Walter N. Kirn; Susan Moeller Zerull

[57] ABSTRACT

A method of making a lithographic printing plate that comprises the steps of:

(a) imagewise exposing a unitary, light sensitive material which consists of a support, at least one negative working light sensitive silver halide layer and a surface physical development nucleating layer, said construction containing a developing agent and electron transfer agent in one or more layers;

(b) processing said printing plate in a diffusion transfer alkaline activator solution containing at least one aminocarboxylic acid complexing agent.

10 Claims, No Drawings

PROCESS FOR REDUCING SLUDGE IN DIFFUSION TRANSFER PRINTING PLATES

A method for making a lithographic printing plate that comprises imagewise exposing a developer incorporated light sensitive material which consists of a support, and at least a negative working silver halide emulsion layer and a surface physical development nucleating layer on said support, and processing said construction in a silver complex diffusion transfer alkaline activator and/or developer containing anti-sludge agents. Said anti-sludge agents comprising an aminocarboxylic acid or an $\alpha,\beta$-enediol.

BACKGROUND OF THE INVENTION

1. Field of the Invention

This invention relates to a method of making a lithographic printing plate by the silver complex diffusion transfer process. In particular, this invention extends the life of the alkaline activator and/or developer solution by reducing the build-up of sludge due to the oxidation of eluted developers from the processed plate.

2. Background of the Art

Photographic precipitates in treatment solutions used in the process of developing silver halide images are well known and understood in the art. Typically the precipitates are due to hard water or silver salt deposition. U.S. Pat. No. 4,310,613 teaches the benefit of quaternary ammonium salts over mercapto-heterocyclic compounds to reduce colored silver sludge in a diffusion transfer process. However, with aminophenol or dihydroxybenzene containing silver halide printing plates processed in a diffusion transfer alkaline activator, a humic acid sludge is formed in developer or activator solutions which limits the useful life of the chemistry.

Ascorbic acid is a well established anti-oxidant, though in photographic applications it is better known as a developer. T. H. James, *The Theory of The Photographic Process*, 4th. Ed., Macmillan Pub., 1977, p.303–304 provides several references of ascorbic acid reducing silver halide.

EP 498,968 and 531,582 describe ecologically improved graphic arts developers for silver halide emulsions by replacing hydroquinone with at least 0.4 molar ascorbic acid.

WO 93/11456 also states that substituting hydroquinone with ascorbic acid in a rapid access non-diffusing silver halide system developer will reduce sludge build-up. The absence of hydroquinone accounts for the lack of sludge.

As applied to diffusion transfer systems, U.S. Pat. No. 3,730,716 discloses improved stability of developed silver in cine film by the use of $\alpha,\beta$-enediols. U.S. Pat. No. 3,549,364 prevents colored developer oxidation products in a diffusion transfer system by using large quantities of ascorbic acid as an alternative to conventional developers.

Specifically referring to diffusion transfer developers for printing plates, U.S. Pat. No. 3,870,479 claims the use of ascorbic acid and its derivatives in a polyhydroxybenzene/1-pheny-3-pyrazolidone or polyhydroxybenzene/p-aminophenol developer that is essentially free of sulfite. In this particular case, ascorbic acid is used to reduce dot fringe in a wash-off system.

Combinations of chelating agents and ascorbic acid as stable rapid access type developers for non-diffusing silver halide imaging materials are described in U.S. Pat. Nos. 3,887,375; 3,938,997 and 3,942,985.

A review of sequestering agents used in black-and-white photographic developers is given in Research Disclosure 79-18837, and includes aminocarboxylic acids for preventing calcium deposits.

With respect to diffusion transfer systems, U.S. Pat. No. 3,857,710 describes a high contrast monobath processing solution, one of the components being EDTA-tetrasodium salt.

EP 546,598 and 546,599 give examples of diffusion transfer chemistries containing EDTA in a two-sheet duplicating paper process.

Aluminum plates processed in a hydroquinone DTR developer and containing EDTA-tetrasodium salt is also an example in WO 93/11468.

Limitations to using aminocarboxylic acids as sequestering agents due to their being non-biodegradable or accelerating developer oxidation in the presence of trace metal ions are given in U.S. Pat. Nos. 5,200,295 and 4,873,180 respectively.

SUMMARY OF INVENTION

The capacity of a diffusion transfer alkaline activator and/or developer solution to process lithographic printing plates is limited by the build-up of sludge formed from oxidized developing agents eluted from the plate. This precipitate of, for example, humic acid salts, is reduced by the presence in the activator and/or developer solution of at least one compound of the structure:

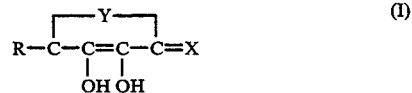  (I)

where R represents hydrogen, an aryl group or a group of the formula:

where n is a positive integer from 1–4 and $R_1$ is either a hydrogen atom or a hydroxyl group when n=2,3 or 4, or is a hydroxyl group when n=1; X is an oxygen atom or an imino group; Y may be an oxygen atom; or at least one compound of the formula

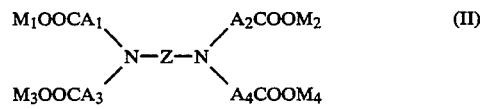  (II)

where A1–A4 each represent an alkylene group, M1–M4 each represent a hydrogen atom or an alkaline metal atom and Z represents a divalent organic group.

DESCRIPTION OF THE INVENTION

This invention provides a longer running alkaline activator and/or developer solution for making a lithographic printing plate by the diffusion transfer process. The process of forming the plate is accomplished by imagewise exposing a single sheet lithographic plate material consisting of a flexible support, having thereon at least a light sensitive silver halide layer and a physical development nucleating surface layer. The lithographic plate is then processed in a diffusion transfer type alkaline activator and/or developer solution containing at least an aminocarboxylic acid or an $\alpha,\beta$-enediol.

In the present invention a single sheet construction is described which comprises a support, on which an antihalation layer, an emulsion layer and a physical nucleating receptor layer are provided. Following imagewise exposure and development the exposed area develops out as a black silver image, while the unexposed silver halide subsequently diffuses through to the receptor element. The physical developing nuclei in the receptor layer reduces the silver halide to a metallic silver complex in the presence of a toning agent.

As described in various embodiments, e.g., U.S. Pat. Nos. 3,728,114, 4,160,670 4,361,635 and EP 375,159, the product produced by such a process can function as a lithographic printing plate due to the oleophilic nature of the complexed silver in the receptor layer and the hydrophilic emulsion layer. However, a very rapid development process is required in order to reduce exposed areas into non-diffusing silver images before the silver halide solvent can take effect. The greater the differentiation between the (unexposed) complexed silver and the (exposed) developed image area, the better the printing quality will be. To achieve this goal, a very active chemistry is required.

In a typical diffusion transfer developer, the high pH causes rapid oxidation of the developing agent. Incorporating the developing agent(s) into the plate material and processing it in an alkaline activator can overcome this limitation of rapid oxidation. However, in developer and/or activator solutions used with diffusion transfer plates containing developer, there will tend to be a build-up of developers eluted from the plate which subsequently oxidize to form insoluble salts of humic acid. Since the alkaline activator life is independent of developer oxidation, the humic acids eventually form a sludge that transfers onto the substrate being developed into a printing plate and interferes with inking of the plate.

It has been found that the addition of an aminocarboxlic complexing agent (e.g., ethylenediaminetetraacetic acid, "EDTA") and/or an anti-oxidant (ascorbic acid and/or its anti-oxidant derivatives), significantly reduces the humic acid sludge. It is particularly surprising that the divalent chelating agents such as EDTA minimizes sludge in the alkaline activator. This class of complexing agent is known to remove metallic impurities from solutions, but was not previously known to provide any protection against sludge formation from the oxidation of polyhydroxybenzene or aminophenol developing agents.

The terms "activator," "spiked activator," and "developer" have accepted meanings within the diffusion transfer printing plate art. An activator is a solution (free of such large levels of developing agent which is normally necessary to develop a diffusion transfer printing plate system, e.g., less than 5 grams per liter of developing agent, particularly polyhydroxybenzene or aminophenol developing agents) which activates the developing agent inactively residing in the printing plate. A spiked activator is an activating solution containing an amount of developing agent ordinarily considered far insufficient to actively develop diffusion transfer printing plates, but sufficient to make the activator solution initiate development more quickly and more intensely. A developer solution contains sufficient developer within the solution to actively develop a diffusion transfer printing plate (whether or not developer is present in the emulsion of the printing plate).

The flexible support according to this invention may be paper, (alpha-olefin polymer coated paper), films such as cellulose acetate, polypropylene, polystyrene, polycarbonate, polyvinyl acetal, polyethylene terephthalate, composite films, metals, metalized paper, or metal/paper laminates.

It is preferred to have a backside coat and at least an undercoat layer on the face-side of said support, usually comprising a hydrophilic polymer, which may also contain dyes or pigments to provide anti-halation or impart certain physical characteristics such as low curl or colored appearance. The preferred hydrophilic polymer is gelatin, especially an inert deionized ossein type gelatin, and may be combined with hydrophilic binders such as starch, albumin, sodium alginate, hydroxyalkylcellulose, gum arabic, polyvinyl alcohol, polyvinyl pyrrolidone, carboxymethylcellulose, polyacrylamide or copolymers of styrene-maleic anhydride or polyvinyl methyl ether-maleic anhydride. The preferred anti-halation pigment in the undercoat layer is carbon black though other dyes or pigments that absorb at the wavelength of the imaging light source may also be used.

Included in both the back-side and face-side underlayer are coating aids such as surfactants, antistatic agents, matting agents, anti-tacking agents and hardening compounds for said hydrophilic binder.

Examples of surfactants include non-ionic surface active agents such as saponin, alkylene oxide derivatives, fluorinated surfactants, glycidol derivatives, fatty acid esters of polyhydric alcohols and alkyl esters of sugars, anionic surface active agents having an acidic group such as carboxyl, sulfo, phosphor, sulfuric acid ester or phosphoric acid ester group, cationic surface active agents such as amino acids, aminoallkylsulfonic acids, aminosulfonic or phosphoric acid esters, alkylbetaines, amine oxides, alkylamine salts, aliphatic or aromatic quaternary ammonium or phosphoric salts, heterocyclic quaternary ammonium and aliphatic or heterocyclic ring-containing phosphonium or sulfonium salts. The matting agent may include silica, colloidal silica, glass powder or starch powder.

The hardening agents may include organic and/or inorganic compounds for example: chromium or aluminum salts, aldehydes, N-methylol compounds, dioxane derivatives, active vinyl compounds such as triacryloyl-hexahydro-S-triazines or vinylsulfones, active halogen compounds such as dichlorohydroxy-S-triazines, or mucohalogenic acids.

Such materials as described above may also be utilized in the light sensitive silver halide layer.

The silver halide used in this invention may consist of silver chloride, silver bromide, silver iodide, silver chlorobromide, silver bromoiodide or mixtures thereof. Included in the silver halide are preferably dopants from Group VIII of the Periodic Table, such as rhodium, ruthenium, iridium or mixtures thereof in the range $10^{-3}$ to $10^{-8}$ mole per mole of silver. The crystalline form of the silver halide may be monodispersed or polydispersed and may also be of the core-shell or tablet type grains. The preferred embodiment of the present invention is a 0.2–0.3 micron ruthenium-iridium doped monodispersed silver chlorobromide emulsion containing at least 60% chloride.

These emulsions can be chemically sensitized by known methods, for example alone or in combination with: sulfur sensitization as described in U.S. Pat. Nos.

1,574,944, 2,278,947, 2,410,689, 3,189,458 or 3,501,313; gold sensitization as disclosed in U.S. Pat. Nos. 2,597,856, 2,597,915 or 2,399,083; reduction sensitization as described in U.S. Pat. Nos. 2,518,698, 2,521,925, 2,487,850 or 2,6694,637. The photographic emulsions used in the present invention may be further sensitized with quaternary ammonium or phosphonium salts, thioether compounds, polyethylene oxide derivatives or diketones as disclosed in U.S. Pat. Nos. 2,708,162, 3,046,132, 3,046,133, 3,046,134 or 3,046,135.

The photographic emulsion of the present invention may be spectrally sensitized to any wavelength in either the visible, ultraviolet or infrared portion of the electromagnetic spectrum by methods known to those skilled in the art. Examples of spectral sensitizers used in the present invention may include anionic, cationic, betaine, cyanine, merocyanine or other sensitizing dyes well known in the photographic art.

The photographic emulsion layer may contain various compounds to prevent fogging of the light sensitive material of the present invention during preparation, storage or during processing. Such antifoggants and stabilizers may include azoles such as benzothiazolium salts, nitroindazoles, triazoles and benzimidazoles; heterocyclic mercapto compounds such as mercaptothiazoles, mercaptobenzothiazoles, mercaptobenzimidazoles, mercaptothiadiazoles or mercaptopyrimidines; thioketo compounds such as oxazolinthione; azaindenes such as tetraazindenes; benzenethiosulfonic acids or benzenesufinic acids.

The receptor layer provided above said emulsion layer contains physical development nuclei, which may be fine particles of metals such as silver, bismuth, antimony, cadmium, cobalt, lead, nickel, palladium, rhodium, gold, platinum, iron, etc., or sulfides, polysulfides or selenides of these metals, or mixtures thereof. The receptor layer may also contain adjuvants such as binders, coating aids, antistatic compounds, hardeners, etc. similar to the examples described in the other coated layers.

As mentioned previously, to differentiate the oleophilic from hydrophilic areas of the plate material, the diffusion transfer process requires an extremely active chemistry that can fully develop out the imaged areas before the silver halide solvent can take effect. One way to increase activity is to increase the alkalinity of the chemistry. However, under such conditions, the developing agent and electron transfer agent may undergo rapid oxidation, thereby adversely affecting image quality and significantly reducing chemistry life. These limitations may be overcome by incorporating the developing agents into the lithographic plate, and subsequently processing in an alkaline activator solution. Developing agents may include polyhydroxybenzenes, such as hydroquinone and electron transfer agents such as 1-phenyl-3-pyrazolidone.

In addition to anti-sludge compounds of the present invention, the alkaline activating solution may also contain water soluble alkali metal hydroxides, such as sodium or potassium hydroxide; a toning or complexing agent such as a mercaptotetrazole, mercaptothiazole or a mercaptothiazoline; a silver halide solvent such as thiocyanate or thiosulphate, electron transfer agents such as 1-phenyl-3-pyrazolidone and other anti-oxidants such as sodium or potassium sulfite. The sulfites are preferably present in an amount within the range of 15 to 100 grams sulfite/liter of developer/activator solution. Other additives may include development accelerators such as polyoxyalkylenes or quaternary ammonium salts, antifoggants such as potassium bromide or iodide, and thickening agents such as carboxymethylcellulose.

The following non-limiting examples further illustrate this invention.

EXAMPLE 1

An alkaline activator was prepared as follows:

| Deionized water, purged with nitrogen @ 1 cfm for 2 hours: 90.09% | |
| --- | --- |
| Potassium sulfite | 5.38% |
| Sodium hydroxide | 2.85% |
| Sodium thiocyanate | 1.50% |
| Benzotriazole | 0.14% |
| 1-phenyl-5-mercaptotetrazole | 0.016% |
| Potassium iodide | 0.02% |

500 grams of the following samples were aerated @725 cc./min. for 7 days at room temperature, after which they were filtered through tared sintered glass funnels, dried overnight at 50° C. and reweighed.

| Sample # | Wt. Sludge (g) |
| --- | --- |
| Control | None |
| Control + 0.01 molar hydroquinone | 0.1360 |
| Control + 0.01 molar hydroquinone + 2.68% potassium sulfite | 0.1353 |
| Control + 0.01 molar hydroquinone + 0.5% EDTA disodium salt | 0.0838 |

While a small amount of potassium sulfite would be consumed in the oxidation process, it is surprising that the excess quantity used in this example was not sufficient to reduce humic acid precipitation. However, the divalent chelating agent EDTA (studied for potential activator concentrate applications), substantially reduced sludge build-up.

EXAMPLE 2

At a coating weight of 0.4 g/m$^2$, processing 800 ft$^2$ plate per gallon of activator will contribute an additional 0.68% hydroquinone to the chemistry. Besides mimicking exhausted chemistry, substituting an equivalent amount of hydroquinone disulfonate would accelerate the sludge test and compensate for the loss of potassium sulfite added as an anti-oxidant.

The following samples were evaluated as per the method given in example 1, at a flow rate of 840 mls./min. for 7 days:

| Sample | Wt. Sludge (g) |
| --- | --- |
| Mk. 12 activator + 2.48% HQDS-K$_2$ | 0.3573 |
| Mk. 12 activator + 2.48% HQDS-K$_2$ + 1.34% K$_2$SO$_3$ | 0.3392 |
| Mk. 12 activator + 2.48% HQDS-K$_2$ + 2.68% K$_2$SO$_3$ | 0.2193 |
| Mk. 12 activator + 2.48% HQDS-K$_2$ + 0.10% EDTA-Na$_2$ | 0.2919 |
| Mk. 12 activator + 2.48% HQDS-K$_2$ + 0.50% EDTA-Na$_2$ | 0.1943 |
| Mk. 12 activator + 2.48% HQDS-K$_2$ + 0.10% Budex 5103 | 0.4052 |
| Mk. 12 activator + 2.48% HQDS-K$_2$ + 0.50% Budex 5103 | 0.3304 |
| Mk. 12 activator + 2.48% HQDS-K$_2$ + 0.10% | 0.3523 |

| Sample | Wt. Sludge (g) |
| --- | --- |
| Polyacrylic acid Mk. 12 activator + 2.48% HQDS-K$_2$ + 0.50% Polyacrylic acid | 0.3970 |
| Mk. 12 activator + 2.48% HQDS-K$_2$ + 0.10% Polyox WSRN10 | 0.4458 |
| Mk. 12 activator + 2.48% HQDS-K$_2$ + 0.50% Polyox WSRN10 | 0.4100 |

While potassium sulfite reduced oxidation of hydroquinone disulfonate, hence sludge, the amount needed represents a 50% increase compared to the control. In terms of molar quantities, EDTA disodium salt appears to be a much more efficient additive for this purpose. Another commonly used chelating agent in photographic developers, Budex TM 5103, did not produce any significant benefit. Despite references to polyacrylic acid and Polyox TM, a polyethylene oxide, being able to reduce silver sludge, these compounds appeared to increase humic acid precipitation.

EXAMPLE 3

Samples of the activator described in Example 1 were prepared to include 0.01 molar hydroquinone, 4-aminophenol or metol, thus providing a spiked activator solution. To these activators, an additional 50% potassium sulfite or 0.01 molar ascorbic acid anti-oxidant were added. 500 grams of these solutions were then aerated for 7 days at 480 mls./min., after which the precipitates were filtered through tared sintered glass funnels, dried and reweighed.

| Sample | Wt. ppt. (g) |
| --- | --- |
| 0.01 M hydroquinone | 0.0908 |
| 0.01 M hydroquinone + 50% potassium sulfite | 0.1388 |
| 0.01 M hydroquinone + 0.01 M ascorbic acid | 0.0425 |
| 0.01 M 4-aminophenol | 0.0692 |
| 0.01 M 4-aminophenol + 50% potassium sulfite | 0.1258 |
| 0.01 M 4-aminophenol + 0.01 M ascorbic acid | 0.0804 |
| 0.01 M Metol | 0.0948 |
| 0.01 M Metol + 50% potassium sulfite | 0.1013 |
| 0.01 M Metol + 0.01 M ascorbic acid | 0.0831 |

Again, potassium sulfite did not reduce the sludge build-up, whereas an alternative anti-oxidant, ascorbic acid, significantly reduced precipitation. The effect of ascorbic acid in aminophenol developers was not as pronounced, which may be attributed to aminophenols exhibiting a slower oxidation rate than dihydroxybenzenes. Sludge reduction was still apparent, however.

EXAMPLE 4

In practical terms, the optimum quantity of anti-oxidant will depend on the rate and amount of plate material processed, development temperature, processor configuration and time in the processor. Although it would be difficult to simulate these conditions in an aeration test, it can be demonstrated that increased developing agent, aeration rate and duration requires additional anti-oxidant. In the following example the level of hydroquinone is increased by 0.068 moles per liter (equivalent to processing 800 ft$^2$/gallon of plate material), and the flow rate increased to 950 mls./min. for 10 days.

| Sample | Wt. Sludge (g) |
| --- | --- |
| Activator + 0.068 M hydroquinone | 0.2970 |
| Activator + 0.068 M hydroquinone + 0.0148 M ascorbic acid | 0.2716 |
| Activator + 0.068 M hydroquinone + 0.01 M ascorbic acid | 0.3119 |
| Activator + 0.068 M hydroquinone + 0.0148 M sodium ascorbate | 0.2647 |
| Activator + 0.068 M hydroquinone + 0.01 M sodium ascorbate | 0.3079 |
| Activator + 0.068 M hydroquinone + 0.0148 M EDTA-Na$_2$ (0.0148 M EDTA-Na$_2$ = 0.5% by wt.) | 0.2984 |

EXAMPLE 5

The following series of aeration experiments were run at 725 mls./min. for 7 days using 500 grams of the activator described in example 1:

| Developer | Developer Amount (Wt. %) | Ascorbic Acid (Wt. %) | Sodium Ascorbate (Wt. %) | Wt. Sludge (g) |
| --- | --- | --- | --- | --- |
| HQ | 0.5 | 0 | 0 | 0.1262 |
| HQ | 0.5 | 1.0 | 0 | 0.1106 |
| HQ | 0.5 | 2.0 | 0 | 0.1217 |
| HQ | 1.0 | 0 | 0 | 0.1598 |
| HQ | 1.0 | 1.0 | 0 | 0.1568 |
| HQ | 1.0 | 2.0 | 0 | 0.1696 |
| HQ | 2.0 | 0 | 0 | 0.1969 |
| HQ | 2.0 | 1.0 | 0 | 0.1790 |
| HQ | 2.0 | 2.0 | 0 | 0.1603 |
| HQ | 0.5 | 0 | 1.0 | 0.1292 |
| HQ | 1.0 | 0 | 1.0 | 0.1419 |
| HQ | 2.0 | 0 | 1.0 | 0.1870 |
| AP | 0.5 | 0 | 0 | 0.0500 |
| AP | 0.5 | 1.0 | 0 | 0.0532 |
| AP | 0.5 | 2.0 | 0 | 0.0530 |
| AP | 1.0 | 0 | 0 | 0.1035 |
| AP | 1.0 | 1.0 | 0 | 0.0952 |
| AP | 1.0 | 2.0 | 0 | 0.1042 |
| AP | 2.0 | 0 | 0 | 0.1329 |
| AP | 2.0 | 1.0 | 0 | 0.1336 |
| AP | 2.0 | 2.0 | 0 | 0.1218 |
| AP | 0.5 | 0 | 1.0 | 0.0554 |
| AP | 1.0 | 0 | 1.0 | 0.0937 |
| AP | 2.0 | 0 | 1.0 | 0.1290 |

Significant responses from Minitab regression analysis were found to be:

| Variable | Coefficient |
| --- | --- |
| Constant | +0.0676 |
| Developer level | +0.0509 |
| Developer type | −0.0380 |
| Developer/Ascorbic acid level | −0.0087 |
| R-sq. = 93.5%; R-sq. (adj.) = 89.3% | |
| Unusual Obs. design pt. #6: Measured = 0.1696 g, Fit = 0.1453 g | |

EXAMPLE 6

The examples above used small volumes in an accelerated test method. Sludge build-up in real life would be more noticeable due to larger volumes of chemistry, plates, silver and deposition of other bye-products over an extended period of time, e.g. 800 ft$^2$/gallon for 4 weeks.

3M model 1144 ™ plate processors were each loaded with 1 gallon of the activator used in Example 1, plus the following additives:

1. 0.01 molar 4-aminophenol.
2. 0.01 molar 4-aminophenol+0.0148 molar ascorbic acid (=0.236%).
3. 0.01 molar 4-aminophenol+0.0148 molar EDTA disodium salt (=0.5%).

Mitsubishi SLM-AC activator was loaded into a fourth processor.

A lithographic printing plate was prepared by coating on a clear gel subbed 4 mil. polyester support: an underlayer consisting of an aqueous carbon black dispersion in deionized inert ossein gelatin, containing hydroquinone, phenidone, silica and formaldehyde; a photosensitive layer consisting of a ruthenium/iridium doped 75:25% silver chlorobromide emulsion sensitized to 633 nm. and having an average grain size of 0.3 microns and coated at 0.7 grams/m² of silver; a physical development nucleating layer containing a palladium sol, a dialdehyde starch and various coating aids.

This plate material was processed through units 1–3 at 20 ft²/day for 4 weeks. A solution of the following composition replenished activator number 1 at a rate of 3.5 cc./ft²:

| Deionized water, purged with nitrogen for 1 hour @ 1 cfm, | 86.27% |
|---|---|
| Sodium hydroxide | 7.98% |
| Potassium sulfite | 4.84% |
| Sodium thiocyanate | 0.63% |
| Benzotriazole | 0.23% |
| 1-phenyl-5-mercaptotetrazole | 0.04% |
| Potassium iodide | 0.008% |

Activators #2 and 3 were replenished with the solution above which also contained 0.0148 molar ascorbic acid and 0.0148 molar EDTA respectively.

An equivalent amount of Mitsubishi Silver Digiplate ™ was processed in sample #4 using Mitsubishi SLM-AC activator as a replenisher solution. The respective 3M ONYX ™ and Mitsubishi SLM-ST stabilizers were used in the second station of the processors.

Sensitometric responses listed below were made by exposing plate samples through a 0–3 density continuous tone wedge using a 633 nm/2 mw laser sensitometer and measuring the DlogE curve on a computerized reflection densitometer. Speed 1 and Speed 2 values listed below were measured at 0.2 and 0.8 of density above Dmin respectively. Contrast values were taken as the gradient between these two speed points.

After 4 weeks, the activator baths were drained, rinsed with the depleted chemistry and filtered. The precipitates were dried for 24 hours at 50° C. and weighed.

| Response | Control | | Ascorbic Acid | | EDTA-Na4 | | Mitsubishi | |
|---|---|---|---|---|---|---|---|---|
| | Start | End | Start | End | Start | End | Start | End |
| Dmin | 0.54 | 0.50 | 0.56 | 0.51 | 0.56 | 0.48 | 0.62 | 0.73 |
| Dmax | 1.34 | 1.34 | 1.33 | 1.35 | 1.32 | 1.37 | 1.35 | 1.41 |
| Speed 1 | 1.60 | 1.55 | 1.58 | 1.54 | 1.58 | 1.56 | 1.74 | 1.87 |
| Speed 2 | 1.29 | 1.25 | 1.26 | 1.26 | 1.28 | 1.24 | 1.25 | 1.43 |
| Contrast | 1.53 | 1.68 | 1.43 | 1.75 | 1.55 | 1.58 | 0.90 | 0.93 |
| Sludge Wt. (g) | 10.23 | | 5.27 | | 6.31 | | 5.73 | |

Optimum exposures from a Linotronic ™ L330 HeNe laser imagesetter were run on a Heidelberg GTO offset press with reverse blanket and a black oil based ink. Little difference in press wear or roll-up was observed from start to finish with plates processed through activators 1–3. However, the Mitsubishi sample after 4 weeks did not fully ink up and also exhibited excessive wear on the reverse blanket press test.

The examples above have demonstrated the ability of EDTA and ascorbic acid to minimize the formation of insoluble salts of humic acid in an activator processed silver halide plate.

We claim:

1. A method of making a lithographic printing plate that comprises the steps of:
   (a) imagewise exposing a unitary, light sensitive material which consists of a support, at least one negative working light sensitive silver halide layer and a surface physical development nucleating layer, said construction containing a developing agent and electron transfer agent in one or more layers; and
   (b) processing said printing plate in a diffusion transfer alkaline activator solution containing at least 0.0148 molar concentration of one aminocarboxylic acid complexing agent.

2. A method according to claim 1 in which said diffusion transfer alkaline activator solution further comprises an ascorbic acid or a salt thereof.

3. A method according to claim 2, wherein such ascorbic acid is a sugar derivative of ascorbic acid, or a stereoisomer or a diastereoisomer of ascorbic acid and its sugar derivatives.

4. A method according to claim 1 wherein said complexing agent is ethylenediaminetetraacetic acid or a salt thereof.

5. A method according to claim 1 wherein said complexing agent is present in the range $1.48 \times 10^{-2}$ to $1 \times 10^{-1}$ molar concentration.

6. A method according to claim 2 wherein said complexing agent is present in the range of $1.48 \times 10^{-2}$ to $5 \times 10^{-2}$ molar concentration.

7. The method of claim 1 wherein said activator is a spiked activator having a polyhydroxy benzene or aminophenol developer therein.

8. The method of claim 2 wherein said activator is a spiked activator having a polyhydroxy benzene or aminophenol developer therein.

9. The method of claim 3 wherein said activator is a spiked activator having a polyhydroxy benzene or aminophenol developer therein.

10. The method of claim 4 wherein said activator is a spiked activator having a polyhydroxy benzene or aminophenol developer therein.

* * * * *